United States Patent
Meng et al.

(10) Patent No.: US 11,558,024 B2
(45) Date of Patent: Jan. 17, 2023

(54) ADJUSTABLE ELECTRICAL NOISE FILTER FOR A VEHICLE

(71) Applicant: TOYOTA MOTOR ENGINEERING & MANUFACTURING NORTH AMERICA, INC., Plano, TX (US)

(72) Inventors: Ming M. Meng, Novi, MI (US); Coh L. Yoshizaki, Wixom, MI (US); Umesh P. Naik, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 470 days.

(21) Appl. No.: 16/844,617

(22) Filed: Apr. 9, 2020

(65) Prior Publication Data
US 2021/0320639 A1    Oct. 14, 2021

(51) Int. Cl.
*H03H 7/01*    (2006.01)
*B60R 16/02*   (2006.01)
*H05K 5/02*    (2006.01)

(52) U.S. Cl.
CPC .......... *H03H 7/0153* (2013.01); *B60R 16/02* (2013.01); *H05K 5/0217* (2013.01)

(58) Field of Classification Search
CPC ............. H03H 1/0007; H03H 7/0153; H03H 11/0472; H03H 11/1291; H03H 2210/00; B60R 16/02; H05K 5/0217

USPC .................................................. 327/551–559
See application file for complete search history.

(56) References Cited

U.S. PATENT DOCUMENTS

| | | | |
|---|---|---|---|
| 4,876,627 A | 10/1989 | Mittler et al. | |
| 5,155,654 A | 10/1992 | Ditlya | |
| 6,775,526 B2 | 8/2004 | Schieke et al. | |
| 8,335,071 B2 | 12/2012 | Takahashi | |
| 9,721,729 B2 | 8/2017 | Mildner et al. | |
| 10,355,666 B2 * | 7/2019 | Nakahori | H03H 9/542 |

FOREIGN PATENT DOCUMENTS

KR    19970008729 A    2/1997

* cited by examiner

*Primary Examiner* — Hai L Nguyen
(74) *Attorney, Agent, or Firm* — Haynes and Boone, LLP

(57) ABSTRACT

Disclosed is a device for filtering electrical noise in a vehicle. The device includes a housing connectable to the vehicle, a variable capacitor, an input signal line coupled to the variable capacitor and couplable to a first conductor that carries electrical signals along with electrical noise of a given amplitude, and an output signal line coupled to the variable capacitor and couplable to a second conductor. When the input signal line is coupled to the first conductor and the output signal line is coupled to the second conductor, the second conductor carries the electrical signals along with electrical noise of reduced amplitude within a range of frequencies. The device also includes a tuner coupled to the housing and configured to adjust a capacitance of the variable capacitor, wherein adjusting the capacitance of the variable capacitor adjusts the range of frequencies.

20 Claims, 4 Drawing Sheets

ADJUSTABLE ELECTRICAL NOISE FILTER FOR A VEHICLE

TECHNICAL FIELD

The subject matter described herein relates to devices and methods for filtering noise in an electrical system of a vehicle. This technology has particular but not exclusive utility for cars and trucks.

BACKGROUND

In electronics, "noise" is an unwanted disturbance in the voltage or amperage of an electrical conductor carrying power or signals. Electrical noise can, for example, affect the quality of electricity on power lines, the integrity of data on signal lines, the quality of signals transmitted or received by antennas, the quality of images on electronic displays, and the quality of audio produced by sound systems. Noise in electronic systems can be produced by a variety of different effects, and can therefore vary significantly in characteristics such as frequency and amplitude. Modern vehicles can incorporate more than 100 separate electronic control units (ECUs), each of which can be a source of electrical noise (e.g., on a CANBUS network), and each of which may be susceptible to electrical noise. Luxury vehicles may tend to have more ECUs than lower-end vehicles.

In the electrical systems of modern vehicles, a filter is often included to filter out electrical noise. Using present technology, such electrical noise filters typically incorporate a fixed capacitor, for example with a capacitance in the range of about 2 microfarads (µF). However, a given capacitance can only filter electrical noise within a given range of frequencies. This may be problematic, since vehicle electrical noise can vary significantly with different vehicle platforms, different vehicle development phases, and which electronic control units (ECUs) or vehicle subsystems are targeted for noise reduction. Therefore, desirable filter values and filter locations may be different in order to filter out unwanted noise for different applications. Currently, this need is addressed by having design engineers calculate desired filter characteristics, test the filter's performance in a test vehicle, and iterate repeatedly until the original equipment manufacturer (OEM) electrical noise standards are satisfied for a particular ECU or subsystem. This process may be both costly and time consuming. Such a filter design process may be especially important in vehicle antenna development, as electrical noise can directly affect signal quality and available bandwidth. Importantly, electrical noise characteristics such as frequency and amplitude can be different between an early stage of the vehicle development and a development stage occurring closer to production, as the electrical system can evolve during this time, along with the components attached to it. This can cause problems in the later stages of vehicle development, where available time may be insufficient to redesign an electrical noise filter, and to source components for the final desired filter values. Accordingly, a need exists for electrical noise filters that can provide filtration across a broader range of frequencies.

The information included in this Background section of the specification, including any references cited herein and any description or discussion thereof, is included for technical reference purposes only and is not to be regarded as limiting.

SUMMARY

Disclosed is an adjustable electrical noise filter that provides filtering across a broader range of frequencies than a comparable non-adjustable filter, in order to correct a wider range of electrical noise in different vehicles across multiple development stages. To accomplish this, the present disclosure provides an adjustable capacitor that permits engineers to change the filter values easily through a knob, screw, or button. In some embodiments, the adjustable noise filter also includes at least one of a magnet and a flexible tab with a bolt hole or screw hole, so the filter can be placed quickly in a desired testing location within the vehicle, and can be bolted onto the vehicle in any of a variety of positions and orientations.

The adjustable electrical noise filter disclosed herein has particular, but not exclusive, utility for cars and trucks. One general aspect of the adjustable electrical noise filter includes a device for filtering electrical noise in a vehicle, including a housing connectable to the vehicle, a variable capacitor positioned within the housing, an input signal line coupled to the variable capacitor and couplable to a first conductor of the vehicle, where the first conductor of the vehicle carries electrical signals along with first electrical noise of a first amplitude, an output signal line coupled to the variable capacitor and couplable to a second conductor of the vehicle, where when the input signal line is coupled to the first conductor of the vehicle and the output signal line is coupled to the second conductor of the vehicle, the second conductor of the vehicle carries the electrical signals along with second electrical noise of a second amplitude, that is smaller than the first amplitude within a range of frequencies. The device also includes a tuner coupled to the housing and configured to adjust a capacitance of the variable capacitor, where adjusting the capacitance of the variable capacitor adjusts the range of frequencies. Other embodiments of this aspect include corresponding computer systems, apparatus, and computer programs recorded on one or more computer storage devices, each configured to perform the actions of the methods.

Implementations may include one or more of the following features. The device further including a means for attaching the housing to the vehicle, the means including at least one of a hook, a tab, a magnet, or a fastener hole. The device wherein the ground is couplable to a chassis of the vehicle by at least one of the hook, the tab, the magnet, or the fastener hole. The device wherein the first conductor of the vehicle and the second conductor of the vehicle include a single conductor including a gap, and where the input signal line is couplable to the single conductor at a first end of the gap and the output signal line is couplable to the single conductor at a second end of the gap. The device wherein the capacitance of the variable capacitor is adjustable within a range of 0 microfarads to 3 microfarads. The device wherein the variable capacitor includes two or more fixed capacitors, and the tuner includes switches for coupling combinations of the two or more fixed capacitors to the input signal line and the output signal line. The device wherein the tuner includes at least one of a screw, a knob, a slider, a rotary switch, a toggle switch, or a set of jumper pins. The device wherein the tuner includes a control circuit. The device further including a measurement circuit configured to measure and report the capacitance of the variable capacitor. The device further including the vehicle.

One general aspect includes a method for filtering electrical noise in a vehicle. The method includes providing a variable capacitor, coupling an input signal line to the variable capacitor and a first conductor of the vehicle, where the first conductor of the vehicle carries electrical signals along with first electrical noise of a first amplitude, coupling an output signal line coupled to the variable capacitor to a second conductor of the vehicle, such that the second conductor of the vehicle carries the electrical signals along with second electrical noise of a second amplitude, that is smaller than the first amplitude within a range of frequencies. The method also includes providing a tuner configured to adjust a capacitance of the variable capacitor and, with the tuner, adjusting the capacitance of the variable capacitor to adjust the range of frequencies. Other embodiments of this aspect include corresponding computer systems, apparatus, and computer programs recorded on one or more computer storage devices, each configured to perform the actions of the methods.

Implementations may include one or more of the following features. The method further including a ground, where the ground is couplable to a conductive surface of the vehicle by at least one of a hook, a tab, a magnet, or a fastener hole. The method wherein the first conductor of the vehicle and the second conductor of the vehicle include a single conductor including a gap, and where the input signal line is coupled to the single conductor at a first end of the gap and the output signal line is coupled to the single conductor at a second end of the gap. The method wherein the capacitance of the variable capacitor is adjustable within a range of 0 microfarads to 3 microfarads. The method wherein the variable capacitor includes two or more fixed capacitors, and the tuner includes switches for coupling combinations of the two or more fixed capacitors to the input signal line and the output signal line. The method wherein the tuner includes at least one of a screw, a knob, a slider, a rotary switch, a toggle switch, a set of jumper pins, or a control circuit. The method further including a measurement circuit configured to measure and report the capacitance of the variable capacitor.

One general aspect includes a system for filtering electrical noise in a vehicle. The system includes the vehicle, a variable capacitor with a capacitance adjustable within a range of 0 microfarads to 3 microfarads, a ground coupled to the variable capacitor and a conductive surface of the vehicle, a conductor of the vehicle, where the conductor includes a gap, an input signal line coupled to the variable capacitor and to the conductor of the vehicle on a first end of the gap, where the input signal line receives electrical signals along with first electrical noise of a first amplitude, and an output signal line coupled to the variable capacitor and to the conductor of the vehicle on a second end of the gap, where the output signal line outputs the electrical signals along with second electrical noise of a second amplitude, that is smaller than the first amplitude within a range of frequencies. The system also includes a tuner configured to adjust a capacitance of the variable capacitor, where adjusting the capacitance of the variable capacitor adjusts the range of frequencies. Other embodiments of this aspect include corresponding computer systems, apparatus, and computer programs recorded on one or more computer storage devices, each configured to perform the actions of the methods.

Implementations may include one or more of the following features. The system where the tuner includes at least one of a screw, a knob, a slider, a rotary switch, a toggle switch, a set of jumper pins, or a control circuit coupled to an input device of the vehicle. The system further including a measurement circuit configured to measure and report the capacitance of the variable capacitor.

This Summary is provided to introduce a selection of concepts in a simplified form that are further described below in the Detailed Description. This Summary is not intended to identify key features or essential features of the claimed subject matter, nor is it intended to limit the scope of the claimed subject matter. A more extensive presentation of features, details, utilities, and advantages of the adjustable electrical noise filter, as defined in the claims, is provided in the following written description of various embodiments of the disclosure and illustrated in the accompanying drawings.

BRIEF DESCRIPTION OF THE DRAWINGS

Illustrative embodiments of the present disclosure will be described with reference to the accompanying drawings, of which.

DETAILED DESCRIPTION

Figure 1:
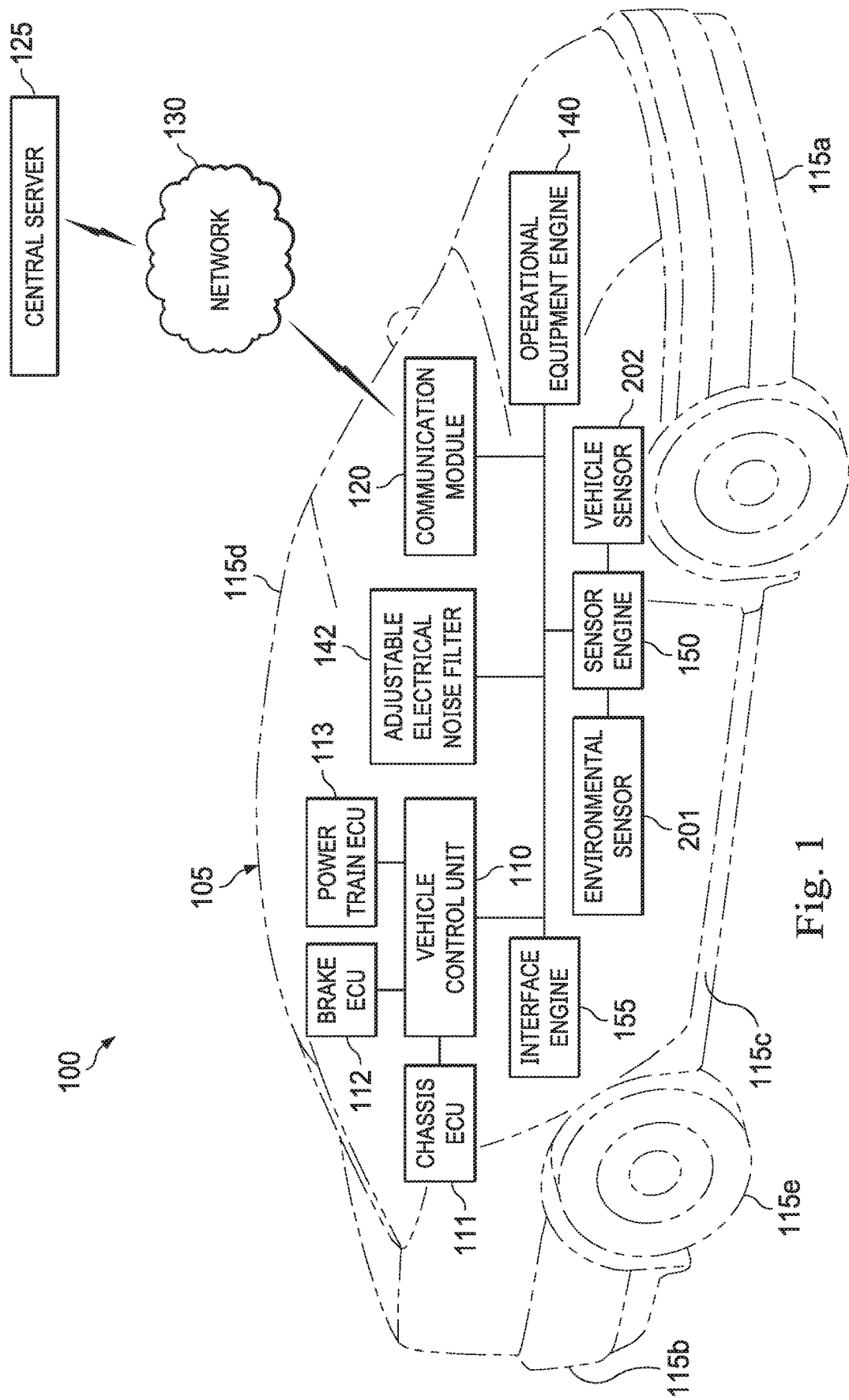
FIG. 1 is a diagrammatic illustration, in a block diagram form, of a vehicle including an adjustable electrical noise reduction system in accordance with at least one embodiment of the present disclosure.

In accordance with at least one embodiment of the present disclosure, an adjustable electrical noise filter is provided that may serve as a standard vehicle component across multiple electrical or electronic subsystems. The adjustable electrical noise filter can provide noise filtering across a broader range of frequencies than may be achieved with a comparable non-adjustable filter, in order to correct a wider range of electrical noise in different vehicles across multiple development stages. To accomplish this, the present disclosure provides an adjustable capacitor that permits engineers to change the filter values easily through a knob or screw, or through a software or firmware setting. In some embodiments, the adjustable noise filter also includes at least one of a magnet and a flexible tab with a hook and/or a bolt hole or screw hole, so the filter can be placed quickly in a desired testing location within the vehicle, and can be attached to the vehicle in any of a variety of positions and orientations to address noise-related electromagnetic interference (EMI) wherever it exceeds established threshold levels.

The adjustable electrical noise filter includes a housing, an attachment point that can be electrically coupled to a chassis ground, and one or more electrical pins that may be connected to a power line or signal line that is experiencing unwanted electrical noise. The present disclosure aids substantially in the reliable operation of vehicle electronics, by improving noise reduction for noise-sensitive ECUs, circuits, components, or subsystems. Implemented as a standalone device that can be spliced into an electrical power or signal line, the adjustable electrical noise filter disclosed herein provides practical reduction in electrical or electronic noise, which may reduce the occurrence of hardware, software, firmware, sensor, display, or auditory anomalies or degradations resulting from electrical noise. This improved performance transforms potentially error-prone vehicle subsystems into more consistent and reliable subsystems, without the normally routine need to design and optimize a specialized noise filter for a specific vehicle subsystem. This unconventional approach improves the functioning of the vehicle, by reducing the occurrence of problems related to electrical noise.

The adjustable electrical noise filter may be implemented with a manual or automatic adjustment feature, and thus some embodiments may include a combination of hardware and/or software, operated by a control process executing on a processor circuit that accepts user inputs (e.g., from a maintenance or development technician), and that is in communication with one or more components of the vehicle's electrical system. In that regard, the control process performs certain specific operations in response to different inputs made at different times. Certain structures, functions, and operations of the processor circuit, sensors, and user input systems are known in the art, while others are recited herein to enable novel features or aspects of the present disclosure with particularity.

These descriptions are provided for exemplary purposes only, and should not be considered to limit the scope of the adjustable electrical noise filter. Certain features may be added, removed, or modified without departing from the spirit of the claimed subject matter.

For the purposes of promoting an understanding of the principles of the present disclosure, reference will now be made to the embodiments illustrated in the drawings, and specific language will be used to describe the same. It is nevertheless understood that no limitation to the scope of the disclosure is intended. Any alterations and further modifications to the described devices, systems, and methods, and any further application of the principles of the present disclosure are fully contemplated and included within the present disclosure as would normally occur to one skilled in the art to which the disclosure relates. In particular, it is fully contemplated that the features, components, and/or steps described with respect to one embodiment may be combined with the features, components, and/or steps described with respect to other embodiments of the present disclosure. For the sake of brevity, however, the numerous iterations of these combinations will not be described separately.

FIG. 1 is a diagrammatic illustration, in a block diagram form, of a vehicle including an adjustable electrical noise reduction system in accordance with at least one embodiment of the present disclosure. In an example, an electrical noise reduction system is referred to by the reference numeral 100 and includes a vehicle 105, such as an automobile, and a vehicle control unit (VCU) 110 located on the vehicle 105. The vehicle 105 may include a front portion 115a (including a front bumper), a rear portion 115b (including a rear bumper), a right side portion 115c (including a right front quarter panel, a right front door, a right rear door, and a right rear quarter panel), a left side portion 115d (including a left front quarter panel, a left front door, a left rear door, and a left rear quarter panel), and wheels 115e. A communication module 120 may be operably coupled to, and adapted to be in communication with, the vehicle control unit 110. The communication module 120 may be adapted to communicate wirelessly with a central server 125 via a network 130 (e.g., a 3G network, a 4G network, a 5G network, a Wi-Fi network, or the like, including communicating via a combination of one or more or networks). The central server 125 may provide information and services including but not limited to include location, mapping, route or path, and topography information.

An operational equipment engine 140 is operably coupled to, and adapted to be in communication with, the vehicle control unit 110. A sensor engine 150 is operably coupled to, and adapted to be in communication with, the vehicle control unit 110. The sensor engine 150 is adapted to monitor various components of, for example, the operational equipment engine 140. An interface engine 155 is operably coupled to, and adapted to be in communication with, the vehicle control unit 110. In addition to, or instead of, being operably coupled to, and adapted to be in communication with, the vehicle control unit 110, the communication module 120, the operational equipment engine 140, the sensor engine 150, and/or the interface engine 155 may be operably coupled to, and adapted to be in communication with, another of the components via wired or wireless communication (e.g., via an in-vehicle network). In some examples, the vehicle control unit 110 is adapted to communicate with the communication module 120, the operational equipment engine 140, the sensor engine 150, and the interface engine 155 to at least partially control the interaction with and between the various components of the electrical noise reduction system 100.

The term "engine" is meant herein to refer to an agent, instrument, or combination of either, or both, agents and instruments that may be associated to serve a purpose or accomplish a task—agents and instruments may include sensors, actuators, switches, relays, power plants, system wiring, computers, components of computers, programmable logic devices, microprocessors, software, software routines, software modules, communication equipment, networks, network services, and/or other elements and their equivalents that contribute to the purpose or task to be accomplished by the engine. Accordingly, some of the engines may be software modules or routines, while others of the engines may be hardware and/or equipment elements in communication with any or all of the vehicle control unit 110, the communication module 120, the network 130, or a central server 125.

In this example, the vehicle 105 also includes a chassis electronic control unit (ECU) 111 which controls elements of the vehicle's suspension system, a brake ECU 112 which controls the braking system or elements thereof, a power train ECU 113 (variously known as an engine ECU, power plant ECU, motor ECU, or transmission ECU) that controls elements of the motor and drivetrain. The system also includes one or more environmental sensors 201, one or more vehicle sensors 202, and an adjustable electrical noise filter 142, the operation of which will be described below.

It is understood that other components or arrangements of components may be found in a vehicle 105, and that the same general principles apply to electric vehicles, internal combustion vehicles, and hybrid vehicles. For example, a power train ECU 113 may control both motor and transmission components. Alternatively, a separate motor ECU and transmission ECU may exist, or some functions of a motor ECU or transmission ECU may be performed by the VCU 110.

Before continuing, it should be noted that the examples described above are provided for purposes of illustration, and are not intended to be limiting. Other devices and/or device configurations may be utilized to carry out the operations described herein.

Figure 2:
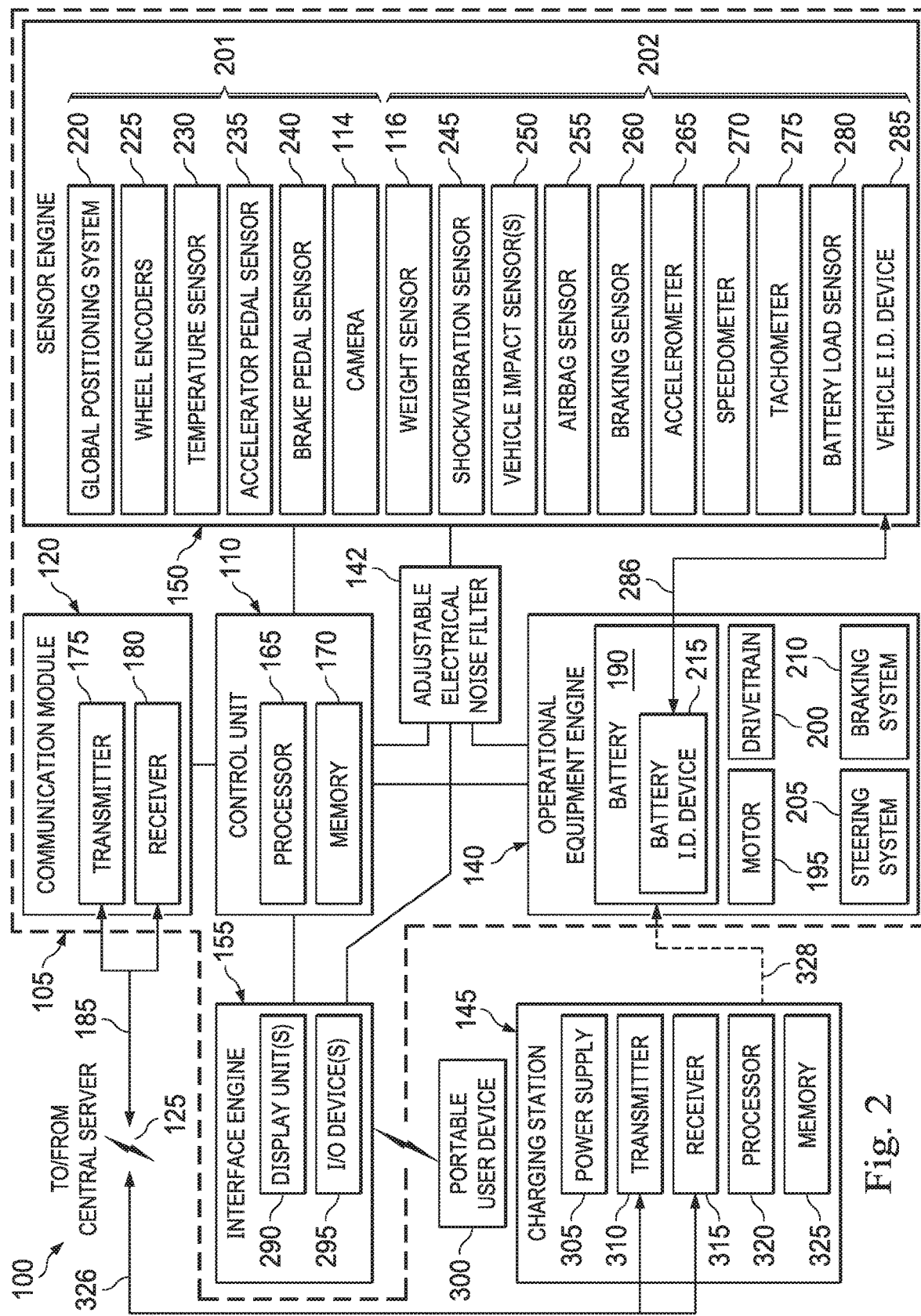
FIG. 2 is a diagrammatic illustration, in a block-diagram form, of at least a portion of the electrical noise reduction system of FIG. 1, in accordance with at least one embodiment of the present disclosure.

FIG. 2 is a diagrammatic illustration, in a block-diagram form, of at least a portion of the electrical noise reduction system 100 of FIG. 1, in accordance with at least one embodiment of the present disclosure. It is noted that the components of the vehicle 105 may be located either permanently or temporarily as a part of the vehicle 105. The vehicle control unit (VCU) 110 includes a processor 165 and a memory 170. In some examples, the communication module 120, which is operably coupled to, and adapted to be in communication with, the vehicle control unit 110, includes a transmitter 175 and a receiver 180. In some examples, one or the other of the transmitter 175 and the receiver 180 may be omitted according to the particular application for which the communication module 120 is to be used. In other examples, the transmitter 175 and receiver 180 are combined into a single transceiver that performs both transmitting and receiving functions.

In some examples, the operational equipment engine 140, which is operably coupled to, and adapted to be in communication with, the vehicle control unit 110, includes a plurality of devices configured to facilitate driving of the vehicle 105. In this regard, the operational equipment engine 140 may be designed to exchange communication with the vehicle control unit 110, so as to not only receive instructions, but to provide information on the operation of the operational equipment engine 140. For example, the operational equipment engine 140 may include a vehicle battery 190, a motor 195, a drivetrain or transmission 200, a steering system 205, and a braking system 210. In some vehicles, the vehicle battery 190 may provide electrical power to the motor 195 to drive the wheels 115e of the vehicle 105 via the drivetrain 200. In some examples, instead of or in addition to providing power to the motor 195 to drive the wheels 115e of the vehicle 105 via the drivetrain or transmission 200, the vehicle battery 190 provides electrical power to another component of the operational equipment engine 140, the vehicle control unit 110, the communication module 120, the sensor engine 150, the interface engine 155, or any combination thereof. In some examples, the vehicle battery 190 includes a battery identification device 215. In some embodiments, the motor is an internal combustion motor and the battery operates a starter.

In some examples, the sensor engine 150, which is operably coupled to, and adapted to be in communication with, the vehicle control unit 110, includes devices such as sensors, meters, detectors, or other devices configured to measure or sense a parameter related to a driving operation of the vehicle 105. For example, the sensor engine 150 may include a global positioning system (GPS) 220, wheel encoders 225, accelerator pedal deflection sensors 235, brake pedal deflection sensors 240, a shock/vibration sensor 245, a vehicle impact sensor 250, an airbag sensor 255, a braking sensor 260, an accelerometer or acceleration sensor 265, a speedometer 270, a tachometer 275, a battery load sensor 280, a vehicle identification device 285, a 2D or 3D camera 114, a weight sensor 116, or any combinations thereof. The sensors or other detection devices may be configured to sense or detect activity, conditions, and circumstances in an area to which the device has access, e.g., conditions inside or outside the vehicle cabin. Sub-components of the sensor engine 150 may be deployed at any operational area where information on the driving of the vehicle 105 may occur. Readings from the sensor engine 150 may be fed back to the vehicle control unit 110, brake ECU 112, power train ECU or hybrid ECU 113, and/or adjustable electrical noise filter 142. Stored and reported performance data may include the sensed data, or may be derived, calculated, or inferred from sensed data. The vehicle control unit 110 may send signals to the sensor engine 150 to adjust the calibration or operating parameters of the sensor engine 150 in accordance with a control program in the vehicle control unit 110. The vehicle control unit 110 is adapted to receive and process performance data from the sensor engine 150 or from other suitable source(s), and to monitor, store (e.g., in the memory 170), and/or otherwise process (e.g., using the processor 165) the received performance data.

The braking sensor 260 is adapted to monitor usage of the vehicle 105's braking system 210 (e.g., an antilock braking system 210) and to communicate the braking information to the vehicle control unit 110 or brake ECU 112. The accelerometer 265 is adapted to monitor acceleration of the vehicle 105 and to communicate the acceleration information to the vehicle control unit 110 or power train ECU 113. The accelerometer 265 may be, for example, a two-axis accelerometer 265 or a three-axis accelerometer 265. In some examples, the accelerometer 265 is associated with an airbag of the vehicle 105 to trigger deployment of the airbag. The speedometer 270 is adapted to monitor speed of the vehicle 105 and to communicate the speed information to the vehicle control unit 110. In some examples, the speedometer 270 is associated with a display unit of the vehicle 105 such as, for example, a display unit of the interface engine 155, to provide a visual indication of vehicle speed to a driver of the vehicle 105. The tachometer 275 is adapted to monitor the working speed (e.g., in revolutions-per-minute) of the vehicle 105's motor 195 and to communicate the angular velocity information to the vehicle control unit 110. In some examples, the tachometer 275 is associated with a display unit of the vehicle 105 such as, for example, a display unit of the interface engine 155, to provide a visual indication of the motor 195's working speed to the driver of the vehicle 105. The battery load sensor 280 is adapted to monitor charging, discharging, and/or overcharging of the vehicle battery 190 and to communicate the charging, discharging, and/or overcharging information to the vehicle control unit 110.

In some examples, the vehicle identification device 285 stores data identifying the vehicle 105 such as, for example, manufacturing information (e.g., make, model, production date, production facility, etc.), vehicle characteristic(s) information, vehicle identification number ("VIN") information, battery compatibility information, or the like. The vehicle identification device 285 is adapted to communicate with the battery identification device 215 (or vice versa), as indicated by arrow 286. In some examples, the vehicle identification device 285 and the battery identification device 215 may each communicate with the vehicle control unit 110.

In some examples, the interface engine 155, which is operably coupled to, and adapted to be in communication with, the vehicle control unit 110, includes at least one input and output device or system that enables a user to interact with the vehicle control unit 110 and the functions that the vehicle control unit 110 provides. For example, the interface engine 155 may include a display unit 290 and an input/output ("I/O") device 295. The display unit 290 may be, include, or be part of multiple display units. In some examples, the display unit 290 may include one, or any combination, of a central display unit associated with a dash of the vehicle 105, an instrument cluster display unit associated with an instrument cluster of the vehicle 105, and/or a heads-up display unit associated with the dash and a windshield of the vehicle 105; accordingly, as used herein the reference numeral 290 may refer to one, or any combination, of the display units. The I/O device 295 may be, include, or be part of a communication port (e.g., a USB port), a Bluetooth communication interface, a tough-screen display unit, soft keys associated with a dash, a steering wheel, or another component of the vehicle 105, and/or similar components. Other examples of sub-components that may be part of the interface engine 155 include, but are not limited to, audible alarms, visual alerts, telecommunications equipment, and computer-related components, peripherals, and systems.

In some examples, a portable user device 300 may be coupled to, and adapted to be in communication with, the interface engine 155. For example, the portable user device 300 may be coupled to, and adapted to be in communication with, the interface engine 155 via the I/O device 295 (e.g., the USB port and/or the Bluetooth communication interface). In an example, the portable user device 300 is a handheld or otherwise portable device (e.g., a smartphone or tablet computer) which is carried onto the vehicle 105 by a user who is a driver or a passenger on the vehicle 105, or proximate to the vehicle. In addition, or instead, the portable user device 300 may be removably connectable to the vehicle 105, such as by temporarily attaching the portable user device 300 to the dash, a center console, a seatback, or another surface in the vehicle 105. In another example, the portable user device 300 may be permanently installed in the vehicle 105. In some examples, the portable user device 300 is, includes, or is part of one or more computing devices such as personal computers, personal digital assistants, cellular devices, mobile telephones, wireless devices, handheld devices, laptops, audio devices, tablet computers, game consoles, cameras, and/or any other suitable devices. In several examples, the portable user device 300 is a smartphone such as, for example, an iPhone® by Apple Incorporated.

Also visible is a charging or fueling station 145, which may provide fuel or energy 328 to the operational equipment engine 140. The charging or fueling station 145 may include a power supply 205, transmitter 310, receiver 315, processor 320, and memory 325.

The electrical noise reduction system 100 also includes an adjustable electrical noise filter 142, the operation of which will be described below. In some embodiments, the adjustable electrical noise filter 142 comprises a standalone housing, which may include its own processor and memory. In other embodiments, the adjustable electrical noise filter 142 exists at least partially as software, firmware, or hardware within another processor, such as the vehicle control unit 110, operational equipment engine 140, brake ECU 112, or power train ECU 113. The sensor engine 150 includes environmental sensors 201 and vehicle sensors 202.

It is understood that other components or arrangements of components may be found in a vehicle 105, and that the same general principles apply to electric vehicles, internal combustion vehicles, and hybrid vehicles.

Figure 3A:
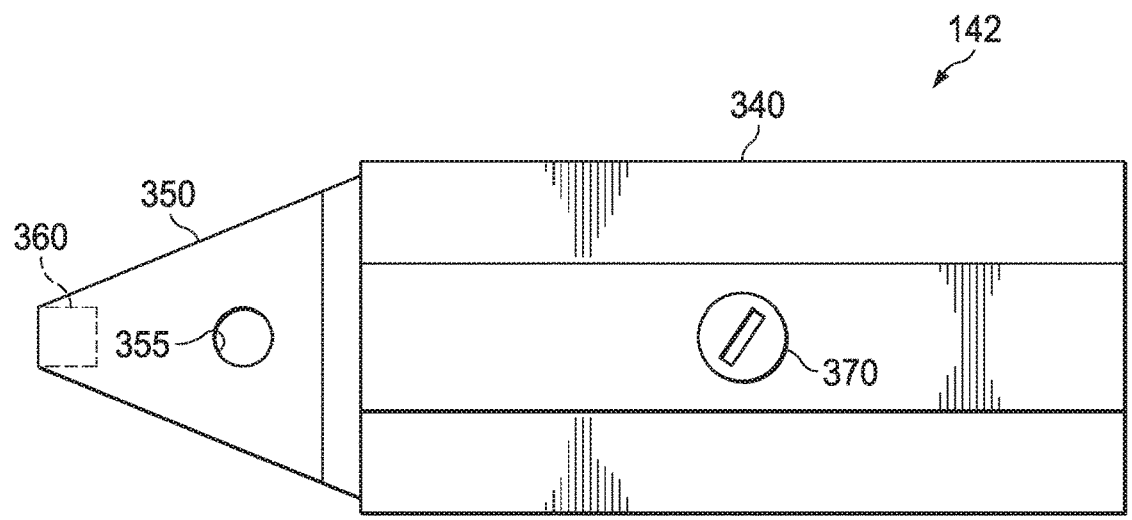
FIGS. 3A, 3B, and 3C are top, side, and front illustrations, respectively, of at least a portion of an example adjustable electrical noise filter in accordance with at least one embodiment of the present disclosure.
Figure 3B:
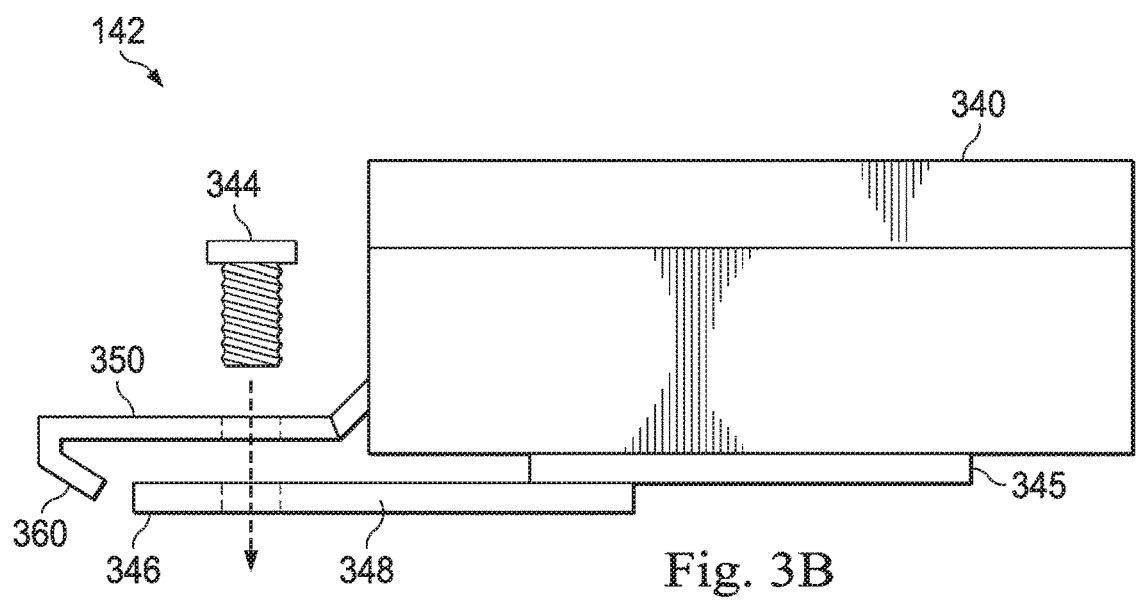
Figure 3C:
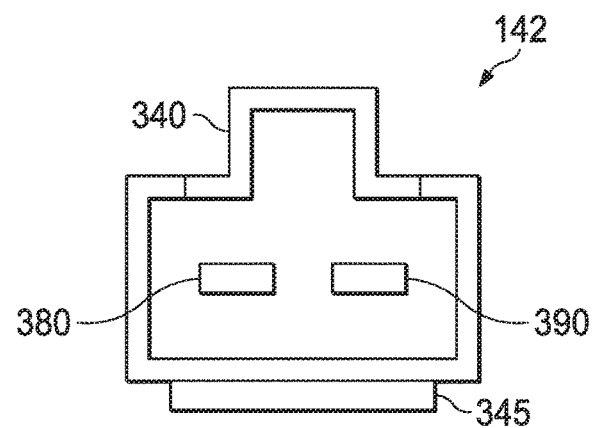

FIGS. 3A, 3B, and 3C are top, side, and front illustrations, respectively, of at least a portion of an example adjustable electrical noise filter 142, in accordance with at least one embodiment of the present disclosure. In this example, the adjustable electrical noise filter 142 includes a housing 340, a magnet 345, a mounting tab 350, a fastener hole 355, a hook 360, a tuner 370, and two electrical leads 380 and 390. The housing 340 and electrical leads 380 and 390 may for example form a male or female electrical connector or electronic connector that can be connected to a complementary male or female connector in an electrical or electronic subsystem (e.g., a hiring harness) of the vehicle 105. Alternatively, the electrical connectors can be spliced into a gap created within an existing signal line or power line within the vehicle 105.

The magnet 345 may be used to facilitate placement of the adjustable electrical noise filter 142 on a metallic surface 348 within the vehicle. The hook 360 can be used to facilitate placement of the adjustable electrical noise filter 142 on a hole or edge 346 of a metallic or nonmetallic surface 348 of the vehicle by hooking to the hole or edge 346. The fastener hole 355 can be used to attach the adjustable electrical noise filter 142 to a metallic or nonmetallic vehicle surface 348 by means of a bolt, screw, pin, rivet, or other fastener 344. In some embodiments, the mounting tab 350 is conductive and serves as a signal ground and/or power ground for the adjustable electrical noise filter 142. In these instances, a metallic fastener 344 can be used to connect the conductive mounting tab 350 to a conductive surface 348 of the vehicle, thus creating a secure chassis. In some instances, the conductive surface 348 is a portion of the vehicle chassis, and the ground is a chassis ground. Depending on the implementation, some embodiments of the adjustable electrical noise filter 142 may have all three of a hook 360, fastener hole 355, and a magnet 345. Other embodiments may have only one or two of these, or may be attached to the vehicle by other methods, including but not limited to welds, solder, adhesive, straps, wires, buckles, brackets, or clips.

In some embodiments, the tuner 370 may be used to adjust the capacitance of the adjustable electrical noise filter 142. In these instances, the tuner 370 may be a screw, a knob, a slider, a rotary switch, a toggle switch, a set of jumper pins, a button or plurality of buttons, or other selector.

Figure 4:
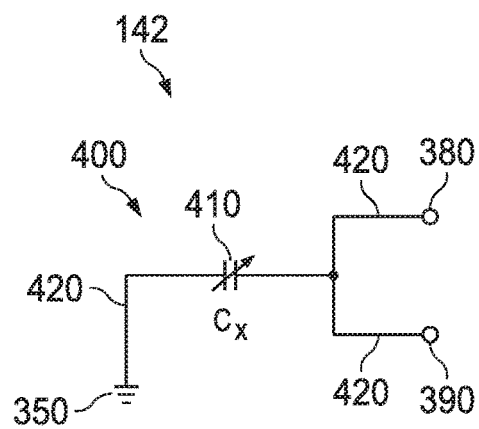
FIG. 4 is a diagrammatic illustration of at least a portion of an example adjustable electrical noise filter, in accordance with at least one embodiment of the present disclosure.

FIG. 4 is a diagrammatic illustration of at least a portion of an example adjustable electrical noise filter 142, in accordance with at least one embodiment of the present disclosure. In this example, the adjustable electrical noise filter 142 includes an adjustable electrical noise filter circuit 400, which comprises a ground 350, a first electrical lead 380, a second electrical lead 390, a variable capacitor 410, and electrical traces 420. In some embodiments, the variable capacitor 410 comprises one or more variable capacitors (e.g., with a capacitance range of 40 picoFarads (pF) to 3.0 microFarads (μF), or other values both larger and smaller). In other embodiments, the variable capacitor 410 may comprise two or more fixed capacitors that can be switched into the adjustable noise filter circuit 400 in various combinations so that, for example, a 1 μF capacitor and a 2 μF capacitor could provide capacitance combinations of 0 μF, 1 μF, 2 μF, and 3 μF, while a 0.1 μF, 0.2 μF, and 0.3 μF capacitor could provide combinations of 0 μF, 0.1 μF, 0.2 μF, 0.3 μF, 0.4 μF, 0.5 μF, and 0.6 μF. Other values and/or numbers of capacitors, both larger and smaller, may be used instead of or in addition to those described above. In an example, the selector 370 of FIG. 3A can be used to select the capacitance of the variable capacitor 410.

In an example, the adjustable electrical noise filter circuit 400 can filter noise on wires within the vehicle that carry power and/or signals at voltages of 0V, 3V, 5V, and 12V, and at currents ranging between 0 milliamperes (mA) and 500 mA. Depending on the implementation, other voltages and/or or amperages, both larger and smaller, may be accommodated by the design (e.g., by adjusting the thickness of electrical traces 420, the physical size of the variable capacitor 410, and other related values). In an example, as a function of capacitance, frequency ranges of between 535 kHz to 5.9 GHz can be filtered.

Figure 5:
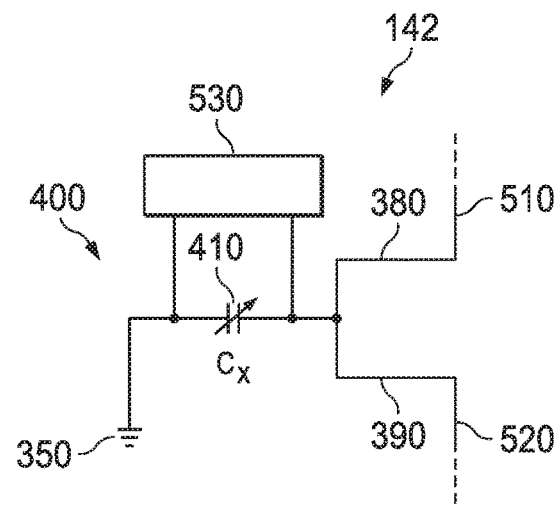
FIG. 5 is a diagrammatic illustration of at least a portion of an example adjustable electrical noise filter, in accordance with at least one embodiment of the present disclosure.

FIG. 5 is a diagrammatic illustration of at least a portion of an example adjustable electrical noise filter 142, in accordance with at least one embodiment of the present disclosure. In this example, the adjustable electrical noise filter 142 includes an adjustable electrical noise filter circuit 400, which comprises a ground 350, a first electrical lead or input signal line 380 connected to a first electrical or electronic wire 510, a second electrical lead or output signal line 390 connected to a second electrical or electronic wire 520, a variable capacitor 410, and a measurement circuit or control circuit 530. In some instances, wires 510 and 520 may be the same wire, with the adjustable electrical noise filter 142 spliced in.

In some embodiments, the capacitance of the variable capacitor 410 is selected by the selector 370 of FIG. 3, and the measurement circuit or control circuit 530 is configured to measure and display the capacitance of the variable capacitor 410. This can be done for example so that vehicle development engineers can tune the adjustable electrical noise filter to a desired setting in order to minimize electrical noise within a given vehicle subsystem, and then record the setting so that it can become part of the standard factory configuration of the production vehicle, or so that a fixed (non-adjustable) electrical noise filter, using that capacitance value, can be installed at that location in production vehicles.

In other embodiments, the capacitance of the variable capacitor 410 may be adjusted automatically by the measurement circuit or control circuit 530 or directly by a user, for example, by using inputs from an I/O device (e.g., I/O device 295 of FIG. 2), touchscreen (e.g., display unit 290 of FIG. 2), or portable user device (e.g., portable user device 300 of FIG. 2) to set the capacitance of the variable capacitor 410 (e.g., by applying a selectable control voltage to it). The selected capacitance may also be displayed on the I/O device, touchscreen, or portable user device, or as part of the measurement circuit or control circuit 530 itself. In some embodiments, automatic adjustment of the capacitance of the variable capacitor 410 by the measurement circuit or control circuit 530 may include feedback loops or machine learning algorithms that measure noise on the first wire 510 or first electrical lead 380, and adjust the capacitance of the variable capacitor 410 based on the frequency and amplitude of the measured noise. For example, the variable capacitor may be adjusted such that its peak filtration frequency or center filtration frequency coincides with the average frequency or center frequency of the measured noise, or with the frequency at which the noise's amplitude is highest, or with a frequency at which the protected subsystem (e.g., the subsystem receiving the power or signals carried on wires 510 and 520) is most vulnerable to the negative effects of the noise. In some cases, updated device settings (e.g., capacitance values) may be supplied by the manufacturer or by a service technician, and loaded manually or automatically into the measurement circuit or control circuit 530.

Figure 6:
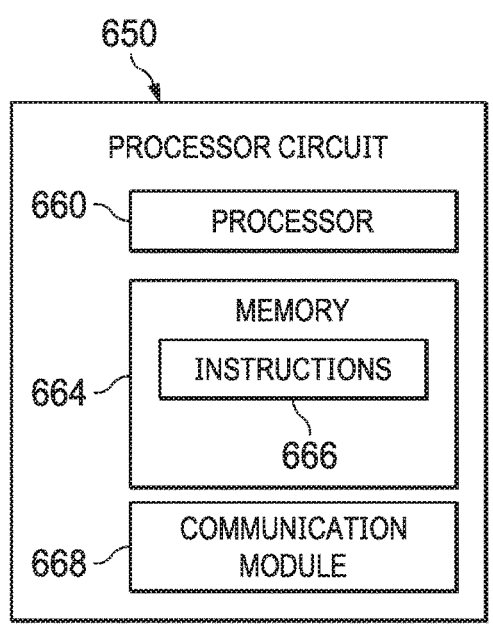
FIG. 6 is a diagrammatic illustration, in a block-diagram form, of a processor circuit, according to embodiments of the present disclosure.

FIG. 6 is a schematic diagram of a processor circuit 650, according to embodiments of the present disclosure. The processor circuit 650 may be implemented in the adjustable electrical noise filter 142 or VCU 110 of FIGS. 1 and 2, the portable device 300 of FIG. 2, other ECUs, or other devices or workstations (e.g., third-party workstations, network routers, etc.), or on a cloud processor or other remote processing unit, as necessary to implement the method. As shown, the processor circuit 650 may include a processor 660, a memory 664, and a communication module 668. These elements may be in direct or indirect communication with each other, for example via one or more buses.

The processor 660 may include a central processing unit (CPU), a digital signal processor (DSP), an ASIC, a controller, or any combination of general-purpose computing devices, reduced instruction set computing (RISC) devices, application-specific integrated circuits (ASICs), field programmable gate arrays (FPGAs), or other related logic devices, including mechanical and quantum computers. The processor 660 may also comprise another hardware device, a firmware device, or any combination thereof configured to perform the operations described herein. The processor 660 may also be implemented as a combination of computing devices, e.g., a combination of a DSP and a microprocessor, a plurality of microprocessors, one or more microprocessors in conjunction with a DSP core, or any other such configuration.

The memory 664 may include a cache memory (e.g., a cache memory of the processor 660), random access memory (RAM), magnetoresistive RAM (MRAM), read-only memory (ROM), programmable read-only memory (PROM), erasable programmable read only memory (EPROM), electrically erasable programmable read only memory (EEPROM), flash memory, solid state memory device, hard disk drives, other forms of volatile and non-volatile memory, or a combination of different types of memory. In an embodiment, the memory 664 includes a non-transitory computer-readable medium. The memory 664 may store instructions 666. The instructions 666 may include instructions that, when executed by the processor 660, cause the processor 660 to perform the operations described herein. Instructions 666 may also be referred to as code. The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may include a single computer-readable statement or many computer-readable statements.

The communication module 668 can include any electronic circuitry and/or logic circuitry to facilitate direct or indirect communication of data between the processor circuit 650, and other processors or devices. In that regard, the communication module 668 can be an input/output (I/O) device. In some instances, the communication module 668 facilitates direct or indirect communication between various elements of the processor circuit 650 and/or the electrical noise reduction system 100. The communication module 668 may communicate within the processor circuit 650 through numerous methods or protocols. Serial communication protocols may include but are not limited to US SPI, I²C, RS-232, RS-485, CAN, Ethernet, ARINC 429, MOD-BUS, MIL-STD-1553, or any other suitable method or protocol. Parallel protocols include but are not limited to ISA, ATA, SCSI, PCI, IEEE-488, IEEE-1284, and other suitable protocols. Where appropriate, serial and parallel communications may be bridged by a UART, USART, or other appropriate subsystem.

External communication (including but not limited to software updates, firmware updates, and device settings) may be accomplished using any suitable wireless or wired communication technology, e.g., a cable interface such as a USB, micro USB, Lightning, or FireWire interface, Bluetooth, Wi-Fi, ZigBee, Li-Fi, or cellular data connections such as 2G/GSM, 3G/UMTS, 4G/LTE/WiMax, or 5G. For example, a Bluetooth Low Energy (BLE) radio can be used to establish connectivity with a cloud service, for transmission of data, and for receipt of software patches. The communication module 668 may be configured to communicate with a remote server, or a local device such as a laptop, tablet, or handheld device, or may include a display capable of showing status variables and other information. Information may also be transferred on physical media such as a USB flash drive or memory stick.

Figure 7:
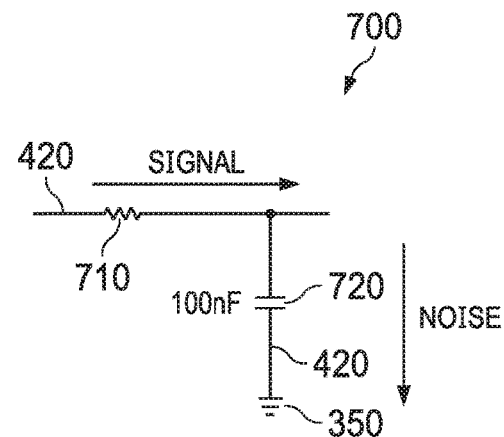
FIG. 7 is a diagrammatic illustration of at least a portion of an example low-pass electrical noise filter circuit, in accordance with at least one embodiment of the present disclosure.

FIG. 7 is a diagrammatic illustration of at least a portion of an example low-pass electrical noise filter circuit 700, in accordance with at least one embodiment of the present disclosure. In this example, the low-pass electrical noise filter circuit 700 comprises a ground 350, electrical leads 420, a resistor 720, and a capacitor 720. A capacitor is a reactive device which can offer higher electrical resistance to lower frequency signals, and lower electrical resistance to higher frequency signals, according to $Xc=\frac{1}{2\pi fc}$. Therefore, the capacitor in this type of filter can filter out high frequency noise (unwanted signals) by sending them to the ground 350, while letting the lower frequency signals (e.g., useful data or power signals) pass. In the example shown in FIG. 7, the resistor has a resistance of 6.2 Ohm and the capacitor has a capacitance of 100 nF or 0.1 µF. In some cases, this will result in signals of $0<f<0.5$ Hz passing almost completely unattenuated through the circuit 700, whereas signals of $0.5$ Hz$<f<3$ Hz will be partially attenuated, and signals of $f>3$ Hz will be almost completely attenuated (e.g., sent to ground).

In another example, a resistance of 0.25 ohm and capacitance of 2.0 mF can be used to filter out noise above about 1605 kHz, while allowing low-frequency signals to pass with little attenuation. In other examples, a resistance of 6.2 Ohm and a capacitance of 100 nF can be used to filter out noise above 1605 kHz, while a resistance of 18.7 Ohm and a capacitance of 100 nF can be used to filter out noise above 1605 kHz (AM band). The resistance can be adjusted based on the desired signal amplitude; the higher the R value, the lower the output signal amplitude. A person of ordinary skill in the art will appreciate that other resistance and capacitance values may be employed to filter other frequency ranges, that the positions of the capacitor 720 and resistor 710 may be reversed to create high-pass or bandpass filters, and that other arrangements of components may be used to create these filtering effects.

As will be readily appreciated by those having ordinary skill in the art after becoming familiar with the teachings herein, the adjustable electrical noise filter advantageously provides a means of inserting a noise filtering capability into nearly any power or signal line within a vehicle, and of adjusting the frequency range of the noise filtering to minimize the noise that exists on that particular power or signal line, or a portion or range of the noise that may be considered problematic for certain subsystems of the vehicle. This provides a filtering capability across a broader range of frequencies than would be possible with a comparable non-adjustable electrical noise filter. Accordingly, when compared to non-adjustable electrical noise filters and/or noise filters that include fewer or less convenient means of attachment to the vehicle, the adjustable electrical noise filter improves the ability of vehicle design engineers to fine-tune the vehicle electrical system to minimize the negative effects associated with electrical noise. This may tend to improve the functioning of production vehicles by improving overall noise reduction, as well as shortening new vehicle development times.

Depending on the implementation, a number of variations are possible on the examples and embodiments described above. For example, the variable capacitor and control circuit may be embodied as software or firmware rather than hardware, e.g., as a variable digital noise filter running on a processor (e.g., a microprocessor or ASIC) or control unit (e.g., the vehicle control unit 110, operational equipment engine 140, brake ECU 112, or power train ECU 113 of FIG. 2). The technology may also be applied to different vehicle types, including on-road and off-road vehicles, electric vehicles, hybrid and internal combustion vehicles, aircraft and watercraft. Other sizes, form factors, attachment methods, voltage ranges, amperage ranges, capacitance ranges, and noise frequency or amplitude ranges may be employed than those described above, in order to provide a desired level of noise reduction for particular applications. The number of input and output signal lines or power lines running through the adjustable electrical noise filter may be different than shown herein, including but not limited to one line, three lines, four lines, eight lines, and other values both larger and smaller.

The logical operations making up the embodiments of the technology described herein are referred to variously as operations, steps, objects, elements, components, layers, or modules. It should be understood that these may occur or be performed or arranged in any order, unless explicitly claimed otherwise or a specific order is inherently necessitated by the claim language. All directional references e.g., upper, lower, inner, outer, upward, downward, left, right, lateral, front, back, top, bottom, above, below, vertical, horizontal, clockwise, counterclockwise, proximal, and distal are only used for identification purposes to aid the reader's understanding of the claimed subject matter, and do not create limitations, particularly as to the position, orientation, or use of the adjustable electrical noise filter or its components. Connection references, e.g., attached, coupled, connected, and joined are to be construed broadly and may include intermediate members between a collection of elements and relative movement between elements unless otherwise indicated. As such, connection references do not necessarily imply that two elements are directly connected and in fixed relation to each other. The term "or" shall be interpreted to mean "and/or" rather than "exclusive or." Unless otherwise noted in the claims, stated values shall be interpreted as illustrative only and shall not be taken to be limiting.

The above specification, examples and data provide an enabling description of the structure and use of exemplary embodiments of the adjustable electrical noise filter as defined in the claims. Although various embodiments of the claimed subject matter have been described above with a certain degree of particularity, or with reference to one or more individual embodiments, those skilled in the art would understand that numerous alterations to the disclosed embodiments are contemplated without departing from the spirit or scope of the claimed subject matter.

Still other embodiments are contemplated. It is intended that all matter contained in the above description and shown in the accompanying drawings shall be interpreted as illustrative only of particular embodiments and not limiting. Changes in detail or structure may be made without departing from the basic elements of the subject matter as defined in the following claims.

What is claimed is:

1. A device for filtering electrical noise in a vehicle, comprising:
   a housing connectable to the vehicle;
   a variable capacitor positioned within the housing;

an input signal line coupled to the variable capacitor and couplable to a first conductor of the vehicle, wherein the first conductor of the vehicle carries electrical signals along with first electrical noise of a first amplitude;

an output signal line coupled to the variable capacitor and couplable to a second conductor of the vehicle, wherein when the input signal line is coupled to the first conductor of the vehicle and the output signal line is coupled to the second conductor of the vehicle, the second conductor of the vehicle carries the electrical signals along with second electrical noise of a second amplitude, that is smaller than the first amplitude within a range of frequencies; and a tuner coupled to the housing and configured to adjust a capacitance of the variable capacitor, wherein adjusting the capacitance of the variable capacitor adjusts the range of frequencies.

2. The device of claim 1, further comprising a means for attaching the housing to the vehicle, the means comprising at least one of a hook, a tab, a magnet, or a fastener hole.

3. The device of claim 2, further comprising a ground, wherein the ground is couplable to a chassis of the vehicle by at least one of the hook, the tab, the magnet, or the fastener hole.

4. The device of claim 1, wherein the first conductor of the vehicle and the second conductor of the vehicle comprise a single conductor comprising a gap, and wherein the input signal line is couplable to the single conductor at a first end of the gap and the output signal line is couplable to the single conductor at a second end of the gap.

5. The device of claim 1, wherein the capacitance of the variable capacitor is adjustable within a range of 0 microfarads to 3 microfarads.

6. The device of claim 1, wherein the variable capacitor comprises two or more fixed capacitors, and the tuner comprises switches for coupling combinations of the two or more fixed capacitors to the input signal line and the output signal line.

7. The device of claim 1, wherein the tuner comprises at least one of a screw, a knob, a slider, a rotary switch, a toggle switch, or a set of jumper pins.

8. The device of claim 1, wherein the tuner comprises a control circuit.

9. The device of claim 1, further comprising a measurement circuit configured to measure and report the capacitance of the variable capacitor.

10. The device of claim 1, further comprising the vehicle.

11. A method for filtering electrical noise in a vehicle, comprising:

providing a variable capacitor;

coupling an input signal line to the variable capacitor and a first conductor of the vehicle, wherein the first conductor of the vehicle carries electrical signals along with first electrical noise of a first amplitude;

coupling an output signal line coupled to the variable capacitor to a second conductor of the vehicle, such that the second conductor of the vehicle carries the electrical signals along with second electrical noise of a second amplitude, that is smaller than the first amplitude within a range of frequencies, and providing a tuner configured to adjust a capacitance of the variable capacitor; and with the tuner, adjusting the capacitance of the variable capacitor to adjust the range of frequencies.

12. The method of claim 11, further comprising a ground, wherein the ground is couplable to a conductive surface of the vehicle by at least one of a hook, a tab, a magnet, or a fastener hole.

13. The method of claim 11, wherein the first conductor of the vehicle and the second conductor of the vehicle comprise a single conductor comprising a gap, and wherein the input signal line is coupled to the single conductor at a first end of the gap and the output signal line is coupled to the single conductor at a second end of the gap.

14. The method of claim 11, wherein the capacitance of the variable capacitor is adjustable within a range of 0 microfarads to 3 microfarads.

15. The method of claim 11, wherein the variable capacitor comprises two or more fixed capacitors, and the tuner comprises switches for coupling combinations of the two or more fixed capacitors to the input signal line and the output signal line.

16. The method of claim 11, wherein the tuner comprises at least one of a screw, a knob, a slider, a rotary switch, a toggle switch, a set of jumper pins, or a control circuit.

17. The method of claim 11, further comprising a measurement circuit configured to measure and report the capacitance of the variable capacitor.

18. A system for filtering electrical noise in a vehicle, comprising:

the vehicle;

a variable capacitor with a capacitance adjustable within a range of 0 microfarads to 3 microfarads;

a ground coupled to the variable capacitor and a conductive surface of the vehicle;

a conductor of the vehicle, wherein the conductor comprises a gap;

an input signal line coupled to the variable capacitor and to the conductor of the vehicle on a first end of the gap, wherein the input signal line receives electrical signals along with first electrical noise of a first amplitude; and an output signal line coupled to the variable capacitor and to the conductor of the vehicle on a second end of the gap, wherein the output signal line outputs the electrical signals along with second electrical noise of a second amplitude, that is smaller than the first amplitude within a range of frequencies; and a tuner configured to adjust a capacitance of the variable capacitor, wherein adjusting the capacitance of the variable capacitor adjusts the range of frequencies.

19. The system of claim 18, wherein the tuner comprises at least one of a screw, a knob, a slider, a rotary switch, a toggle switch, a set of jumper pins, or a control circuit coupled to an input device of the vehicle.

20. The system of claim 18, further comprising a measurement circuit configured to measure and report the capacitance of the variable capacitor.

* * * * *